(12) United States Patent  (10) Patent No.: US 7,791,174 B2
Johnson  (45) Date of Patent: *Sep. 7, 2010

(54) WAFER TRANSLATOR HAVING A SILICON CORE ISOLATED FROM SIGNAL PATHS BY A GROUND PLANE

(75) Inventor: Morgan T. Johnson, Portland, OR (US)

(73) Assignee: Advanced Inquiry Systems, Inc., Hillsboro, OR (US)

( * ) Notice: Subject to any disclaimer, the term of this patent is extended or adjusted under 35 U.S.C. 154(b) by 250 days.

This patent is subject to a terminal disclaimer.

(21) Appl. No.: 12/077,670

(22) Filed: Mar. 20, 2008

(65) Prior Publication Data

US 2009/0224372 A1 Sep. 10, 2009

Related U.S. Application Data

(63) Continuation-in-part of application No. 12/074,904, filed on Mar. 7, 2008, now abandoned.

(51) Int. Cl.
*H01L 29/40* (2006.01)
(52) U.S. Cl. ........... 257/621; 257/774; 257/E23.174; 257/E21.597; 438/675; 29/830; 29/837
(58) Field of Classification Search .......... 257/621, 257/774, E23.174, E21.597; 438/675; 29/837, 29/830
See application file for complete search history.

(56) References Cited

U.S. PATENT DOCUMENTS

2008/0142976 A1* 6/2008 Kawano ............... 257/758
2008/0265430 A1* 10/2008 Ishihara ............... 257/777
2009/0001550 A1* 1/2009 Li et al. ............... 257/700

* cited by examiner

*Primary Examiner*—Tan N Tran
(74) *Attorney, Agent, or Firm*—Raymond J. Werner (57) ABSTRACT

Apparatus and methods are provided for wafer translators having a silicon core, an isolating conductive ground plane, and copper and subjacent resin layers disposed on the ground plane. A silicon substrate having at least one major surface coated with an electrically conductive layer is subjected to a number of printed circuit board manufacturing operations including, but not limited to, application of resin-coated copper foils; mechanical grinding of copper layers; mechanical drilling of via openings in a dielectric material; plating of copper, nickel, and gold layers; laser removal of metal; and chemical removal of metal; in order to produce a wafer translator having a silicon core. In further aspects of the present invention, alignment marks are formed and contact structures, such as stud bumps, are placed relative to a local set of alignment marks.

15 Claims, 10 Drawing Sheets

WAFER TRANSLATOR HAVING A SILICON CORE ISOLATED FROM SIGNAL PATHS BY A GROUND PLANE

RELATED APPLICATIONS

This application is a continuation in part of application Ser. No. 12/074,904, filed 7 Mar. 2008 now abandoned, and entitled "A Wafer Translator Having A Silicon Core Fabricated With Printed Circuit Board Manufacturing Techniques", the entirety of which is hereby incorporated by reference.

FIELD OF THE INVENTION

The present invention relates generally to semiconductor test equipment, and more particularly relates to methods and apparatus for providing electrical pathways between the pads of integrated circuits on a wafer and circuitry external to the wafer.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

It has been common to mount the wafer on a moveable chuck, which is used to position the wafer relative to a probe card, and to hold the wafer in place during testing. In alternative arrangements for testing the unsingulated integrated circuits of a wafer, a wafer translator is disposed between the wafer and any other testing or connection apparatus.

The wafer translator provides simultaneous access to a plurality of integrated circuits on the wafer, up to and including all the integrated circuits on the wafer.

What is needed are efficient and reliable methods for producing wafer translators.

SUMMARY OF THE INVENTION

Briefly, wafer translators having a silicon core an isolating ground plane and copper and subjacent resin layers disposed on the ground plane, along with methods of manufacturing such wafer translators are described herein. A silicon substrate having at least one major surface coated with an electrically conductive layer is subjected to a number of printed circuit board manufacturing operations including, but not limited to, application of resin-coated copper foils; mechanical grinding of copper layers; mechanical drilling of via openings in a dielectric material; plating of copper, nickel, and gold layers; laser removal of metal; and chemical removal of metal; in order to produce a wafer translator having a silicon core.

In further aspects of the present invention, alignment marks are formed and contact structures, such as stud bumps, are placed relative to a local set of alignment marks.

DETAILED DESCRIPTION

Generally, a wafer translator (see below for detailed discussion) is formed with processing steps not previously applied to silicon wafers, or substrates, in order to form a unique apparatus having a coefficient of thermal expansion substantially equal to that of a wafer having integrated circuits to be tested, or otherwise operated.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to herein simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The thickness of a conductive layer on printed circuit boards and similar substrates, is sometimes referred to in this field in terms of ounces (oz.). This is based on the weight of one square foot of a conductive layer of a particular material and thickness. For example, a thickness referred to as 0.5 oz. copper, is approximately 18 microns thick, because one square foot of copper, plated on a substrate to a thickness of 18 microns, weighs 0.5 oz. Similarly, a thickness referred to as 1.0 oz. copper, is approximately 36 microns thick, and so on.

The term, via, refers to a structure for electrical connection of conductors from different interconnect levels. The term, via, is sometimes used in the art to describe both an opening in an insulator in which the structure will be completed, and the completed structure itself. For purposes of this disclosure, "via" refers to the completed structure, and "via opening" refers to an opening through an insulator layer which is subsequently filled with a conductive material.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

FIGS. 1-14 illustrate the physical structure of various stages of construction and operation of a wafer translator having a silicon core and ground plane isolation from signal paths disposed on the major surfaces thereof. These figures are for illustration and are not necessarily to scale.

Figure 1:
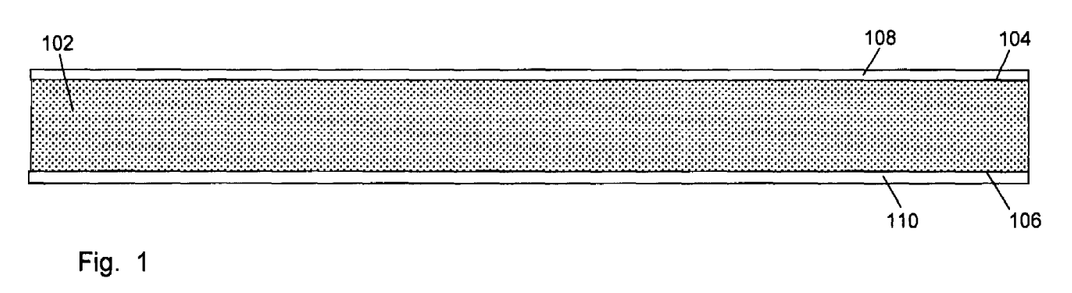
FIG. 1 is a cross-sectional representation of a silicon substrate with an aluminum layer on each major surface prior to the manufacturing operations for fabricating a silicon core wafer translator with ground plane isolation between the silicon core and the signal paths of the wafer translator.

Referring to FIG. 1, a cross-sectional representation a silicon substrate, or core, 102 for a wafer translator is shown. It is noted that silicon core 102 has two major surfaces 104, 106 that are each substantially planar. Silicon core 102 is not required to have a particular shape or size, although typical embodiments have silicon cores that are roughly circular. In typical embodiments, silicon core 102 is similar in shape and thickness to a semiconductor wafer, but commonly has a diameter greater than that of the wafer to which it will be removably attached. An electrically conductive layer 108 is disposed on major surface 104 of silicon core 102, and an electrically conductive layer 110 is disposed on major surface 106 of silicon core 102. In this illustrative embodiment, conductive layers 108, 110 are aluminum.

Figure 2:
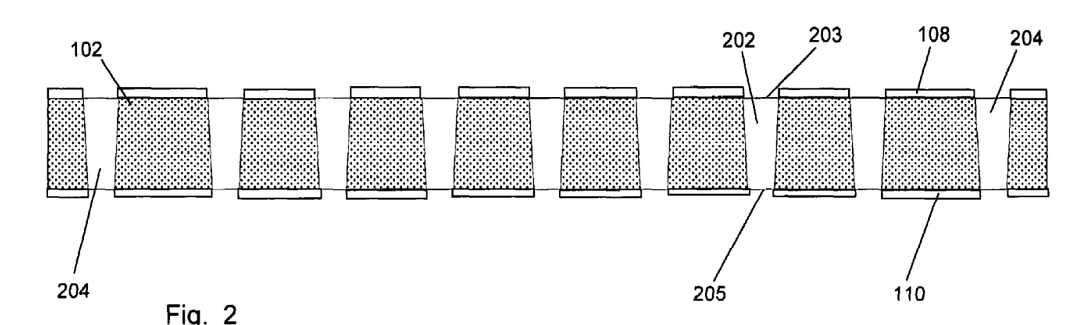
FIG. 2 is a cross-sectional representation of the silicon wafer of FIG. 1 after a plurality of through-holes have been formed.

FIG. 2 is a cross-sectional representation of silicon core 102 subsequent to the formation of at least one through-hole 202. Each through-hole 202 provides a first opening 203 in first surface 104, a second opening 205 in second surface 106, and a passageway through silicon substrate 102 from first surface 104 to second surface 106. It is noted that in the illustrative embodiment shown here, first opening 203 is larger than second opening 205. Further, two or more tooling holes 204 are formed through silicon substrate 102. These tooling holes are typically formed near the peripheral edges of silicon substrate 102, in regions where active electrical pathways will not exist in the finished wafer translator. Tooling holes 204, like through-holes 202, each have a first opening on the first side that is larger than a second opening on the second side. In subsequent process operations tooling holes 204 are used for aligning the partially constructed wafer translator to a mechanical drilling system. Typically, the mechanical drilling system uses tooling holes 204 to determine an x-y offset, for use in drilling holes in the desired locations in silicon substrate 102. Commercially available mechanical drilling systems have visual alignment subsystems for determining x-y offset from marks such as tooling holes 204.

Figure 3:
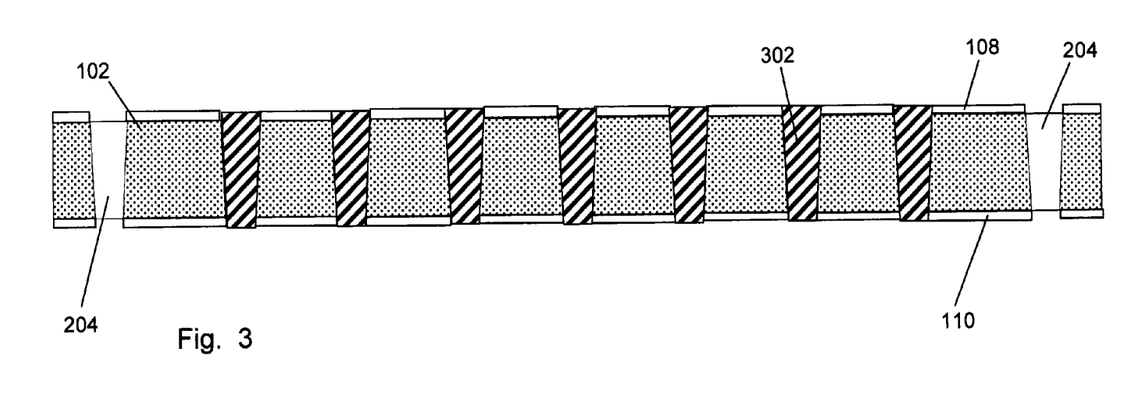
FIG. 3 is a cross-sectional representation of the partially constructed wafer translator of FIG. 2 after an organic dielectric material has been disposed in the through-holes, while the tooling holes are maintained in an unfilled state.

FIG. 3 is a cross-sectional representation of the partially constructed wafer translator of FIG. 2 after an organic dielectric material 302 has been disposed in through-holes 202. Tooling holes 204 are not filled with the dielectric material. A masking layer, or alternatively a stencil, is used to prevent the dielectric material from entering tooling holes 204. In this illustrative embodiment, through-holes 202 are filled with organic dielectric material in a single process, and are subjected to a moderate temperature cure. In this illustrative embodiment, the range for the moderate temperature cure is between approximately 150° C. to 270° C. It is noted that no firing steps are required. It is noted that such organic dielectrics are commonly epoxies of various commercially available formulations.

Figure 4:
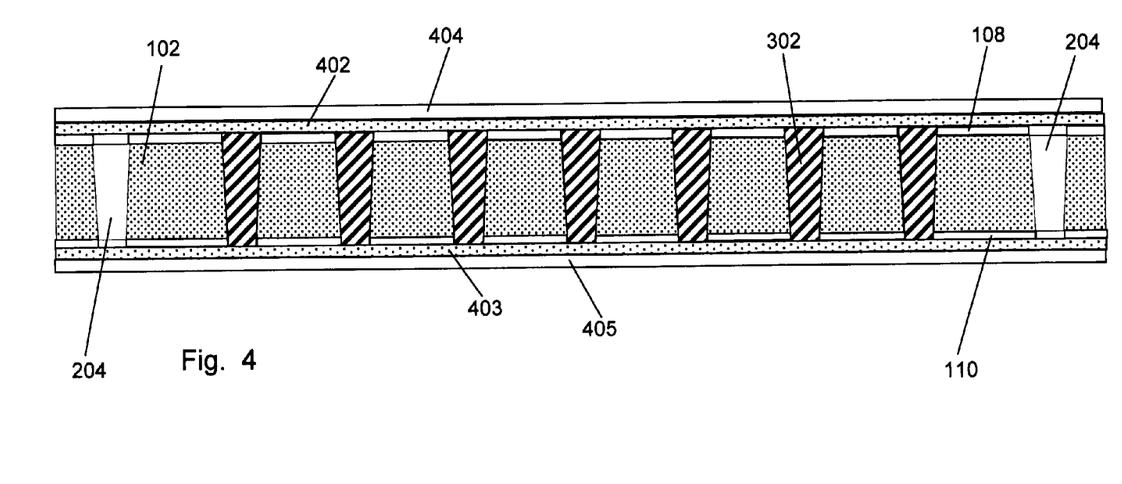
FIG. 4 is a cross-sectional representation of the partially constructed wafer translator of FIG. 3 after a resin coated copper foil has been disposed on each of the major surfaces.

FIG. 4 is a cross-sectional representation of the partially constructed wafer translator of FIG. 3 after a first resin coated copper (RCC) foil 402, 404 has been disposed on conductive layer 108, and a second resin coated copper foil 403, 405 has been disposed on conductive layer 110. In this illustrative embodiment, the copper layer is approximately 17 microns thick, and the RCC foil is applied in a single process to both sides.

Figure 5:
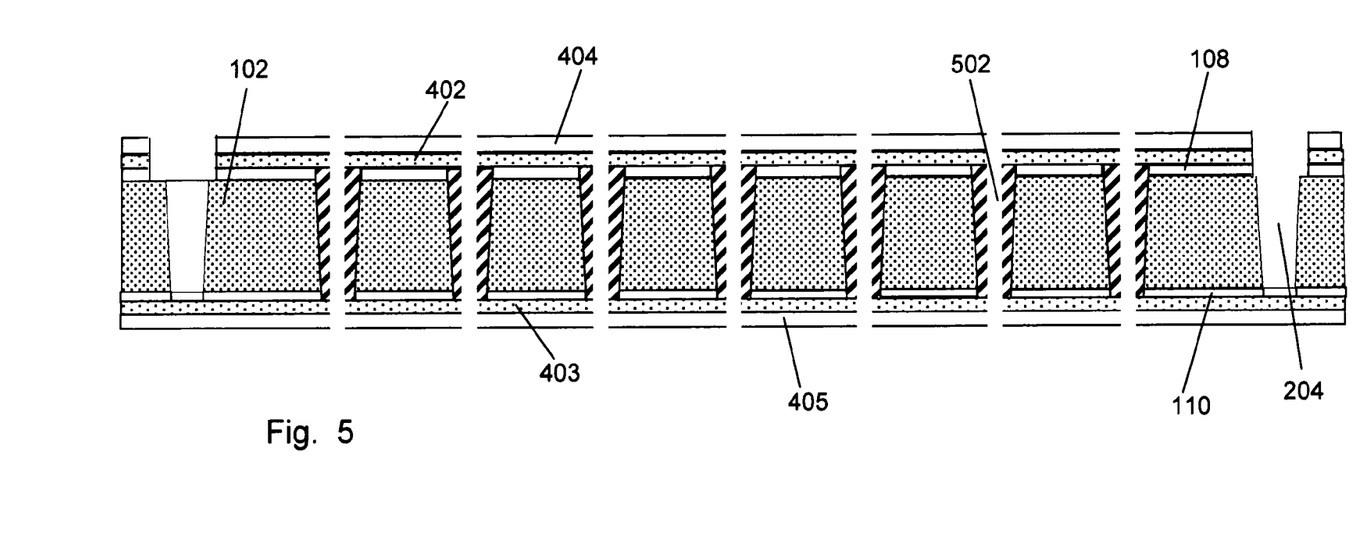
FIG. 5 is a cross-sectional representation of the partially constructed wafer translator of FIG. 4 after via openings are mechanically drilled through the metal and resin layers and through organic dielectric material disposed in the through-holes.

FIG. 5 is a cross-sectional representation of the partially constructed wafer translator of FIG. 4 after tooling holes 204 are uncovered, a drilling system determines x-y offsets from observing the positions of the uncovered tooling holes 204, and via openings 502 are mechanically drilled through metal and resin layers, and through organic dielectric material 302 which fills through-holes 202. Tooling holes 204 may be uncovered by, for example, mechanical drilling or laser ablation of portions of the RCC foil. In other words, the uncovered tooling holes are used to "align" the mechanical drilling system to drill vias through the RCC layers and the dielectric material disposed in the through-holes. In typical embodiments, the mechanically drilled via openings 502 are nominally centered within the through-holes 202. It is noted that via openings 502 provide passages completely through the partially constructed wafer translator. It is further noted that via openings 502 are electrically insulated from silicon core 102 by the remaining (i.e., post-drilling) portion of organic dielectric material 302. Via openings 502 each have an inner diameter that is substantially uniform from one major surface of the partially constructed wafer translator to the other. Mechanical drilling is typically faster than laser etching for forming these via openings. In typical embodiments, the mechanical drilling system looks at, that is, aligns to, tooling holes 204 disposed near the peripheral edges of silicon core 102.

Figure 6:
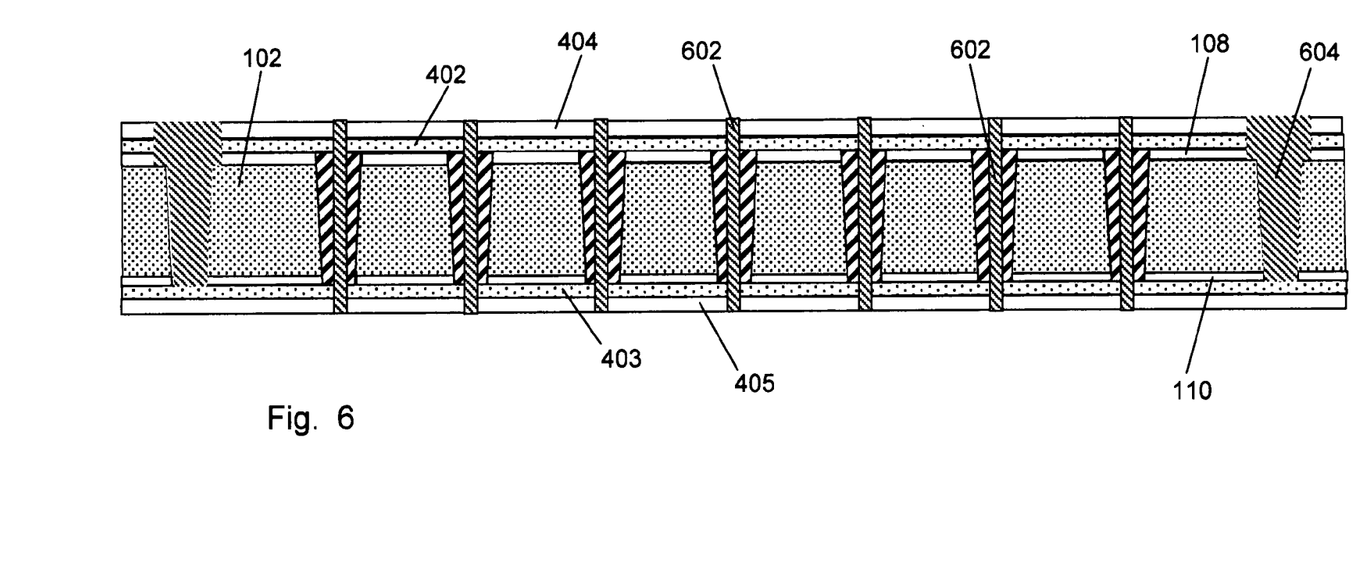
FIG. 6 is a cross-sectional representation of the partially constructed wafer translator of FIG. 5 after via openings are given a conductive fill with an airtight process.

FIG. 6 is a cross-sectional representation of the partially constructed wafer translator of FIG. 5 after via openings 502 are given a conductive fill 602 with an airtight process. It is noted that there is no via plating operation performed on the surfaces of the via openings prior to filling with conductive material.

Figure 7:
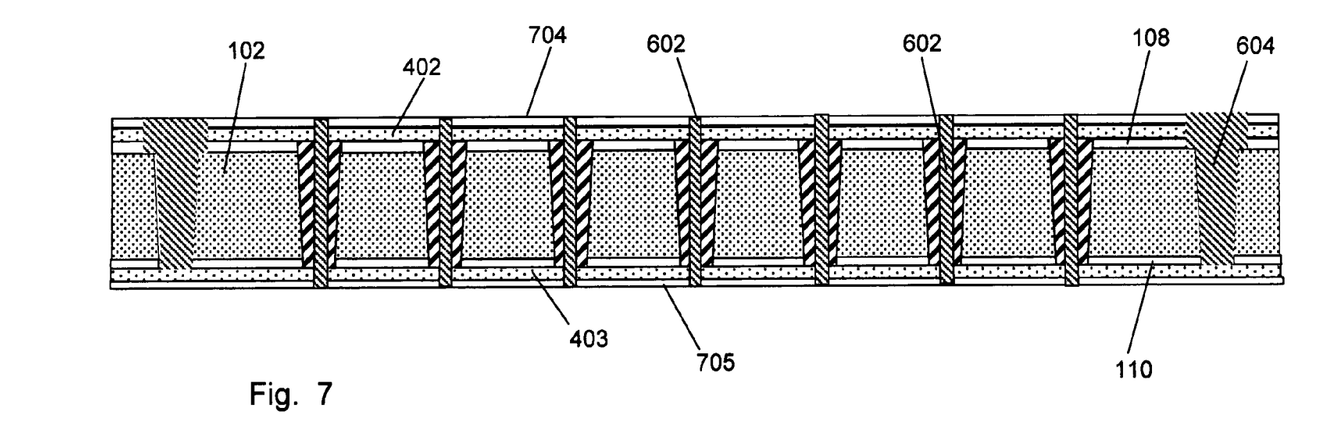
FIG. 7 is a cross-sectional representation of the partially constructed wafer translator of FIG. 6 after the vias and the copper are ground flat.

FIG. 7 is a cross-sectional representation of the partially constructed wafer translator of FIG. 6 after vias 602 and copper layers on both major surfaces are ground flat by a precision grinding operation to form a first flattened copper surface 704 and a second flattened copper surface 705. This process may also be referred to as planarization. In this illustrative embodiment, this planarization operation is a commonly used printed circuit board technology. For example, spinning ceramic cylinders, or rollers, are used to grind down the surface to make it flat.

Figure 8:
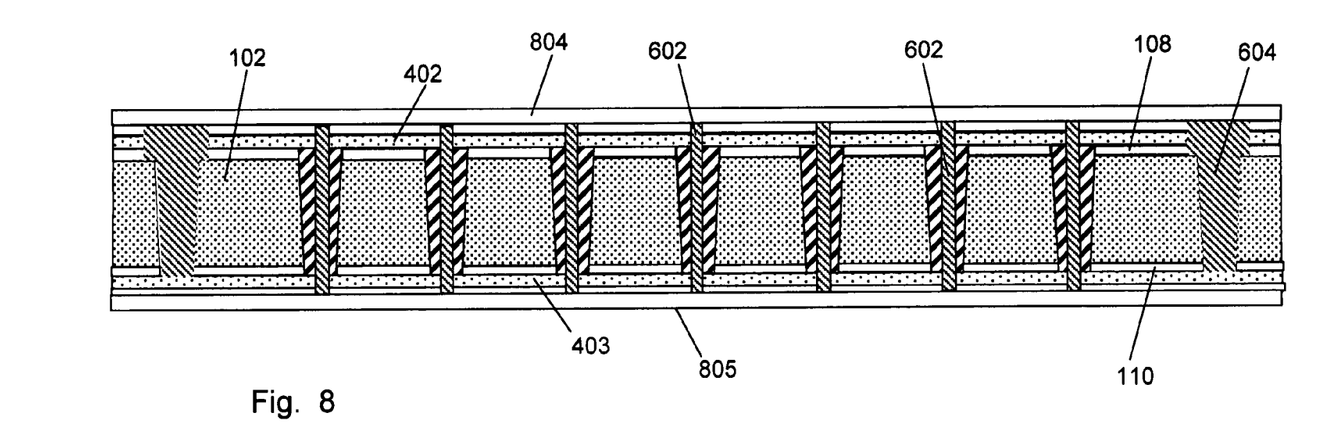
FIG. 8 is a cross-sectional representation of the partially constructed wafer translator of FIG. 7 after copper is plated up across the planarized major surfaces, thereby forming an unbroken surface.

FIG. 8 is a cross-sectional representation of the partially constructed wafer translator of FIG. 7 after a first copper layer 804 is plated up on copper surface 704, and a second copper layer 805 is plated up on copper surface 705. In typical embodiments, both copper layers 804, 805 are plated at the same time, and across the whole of surfaces 704, 705. Copper layers 804, 805 typically have a thickness in the range of 8 to 18 microns.

Figure 9:
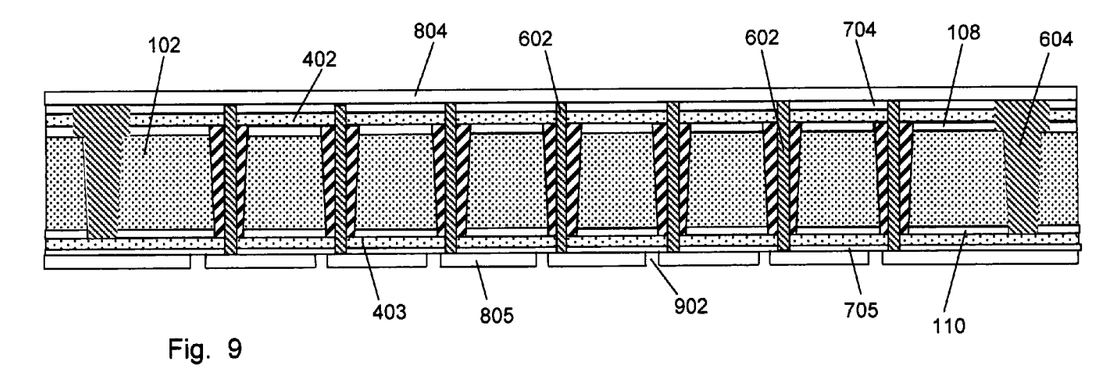
FIG. 9 is a cross-sectional representation of the partially constructed wafer translator of FIG. 8 after alignment marks are etched in copper prior to nickel and gold plating.

FIG. 9 is a cross-sectional representation of the partially constructed wafer translator of FIG. 8 after alignment marks 902 are etched in copper layer 805 prior to nickel and gold plating. Alignment marks 902 may be etched in the form of crosses, circles, X's, L's, or other suitable shapes dependent upon the vision system used during the alignment process. In embodiments where the alignment process is based upon pattern recognition, then the alignment marks are relatively shallow, that is, 6 to 10 microns deep. In embodiments where the alignment process is based upon edge detection, then the alignment marks are relatively deeper, that is, 10 or more microns deep. It will be appreciated that prior to etching alignment marks 902, both copper layers 804 and 805 are substantially identical. The side of the partially constructed wafer translator on which alignment marks 902 are etched becomes the wafer-side of the wafer translator.

Alignment marks 902 may be positioned on the wafer-side of partially constructed wafer translator in a variety of ways. In some embodiments, alignment marks 902 are disposed so as to be uniformly spaced apart. In other embodiments, alignment marks 902 are disposed in a pattern such that a plurality of local sets of alignment marks exist. These local sets of alignment marks are disposed on a per die basis. That is, since the contact structures (see FIG. 11) of the completed wafer translator will be aligned with and contacted to the pads of unsingulated integrated circuits (i.e., dice) on a wafer, the contact structures themselves are grouped to match corresponding die on the wafer. Since the contact structures are grouped, the alignment marks are grouped, or localized, to improve the placement accuracy of the contact structures. In still other embodiments, the local sets of alignment marks are disposed at locations on the wafer-side of the wafer translator that correspond to die corner locations on the wafer to be removably attached to the wafer translator. These die corner location alignment marks are shared between the operations of attaching adjacent groupings of contact structures to the wafer-side of the wafer translator.

In some embodiments, since copper layers 804 and 805 are substantially identical, copper layer 805 is selected to have alignment marks etched therein based on knowledge of how the partially constructed wafer translator has been handled by manufacturing equipment up to this point in the process. Alternatively, an arbitrary side of the partially constructed wafer translator is selected in which alignment marks 902 are to be formed.

Figure 10:
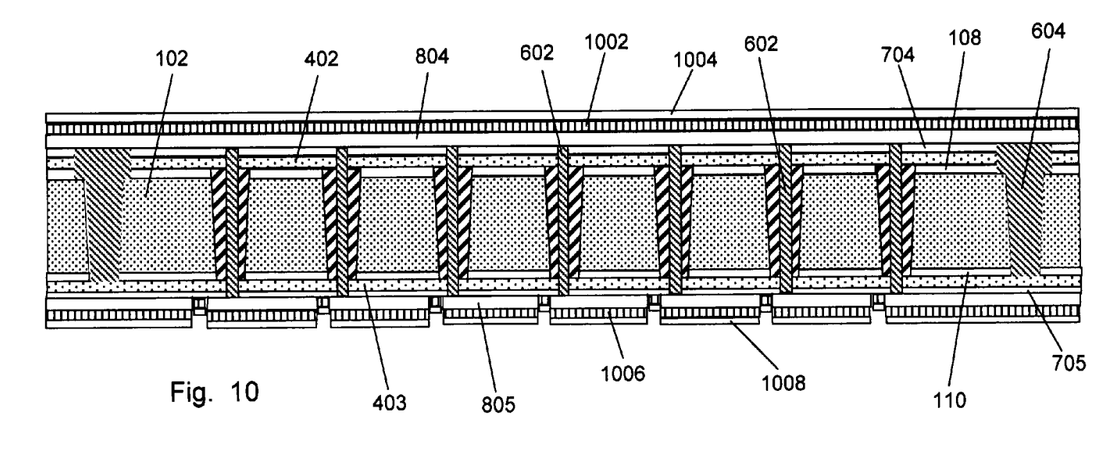
FIG. 10 is a cross-sectional representation of the partially constructed wafer translator of FIG. 9 after both major surfaces are plated with nickel and the nickel layers are plated with gold.

FIG. 10 is a cross-sectional representation of the partially constructed wafer translator of FIG. 9 after a nickel layer 1002 is plated over copper layer 804; a gold layer 1004 is plated over nickel layer 1002; a nickel layer 1006 is plated over copper layer 805; and a gold layer 1008 is plated over nickel layer 1006. Nickel layers 1002, 1006 typically have a thickness in the range of 150 to 600 microinches, and gold layers 1004, 1008 typically have a thickness in the range of 20 to 60 microinches. It is noted that the sidewalls of alignment marks 902 are plated with nickel 1006 and gold 1008, however the sidewall plating thicknesses tend to be less than the thickness of the base portion of the alignment marks.

Figure 11:
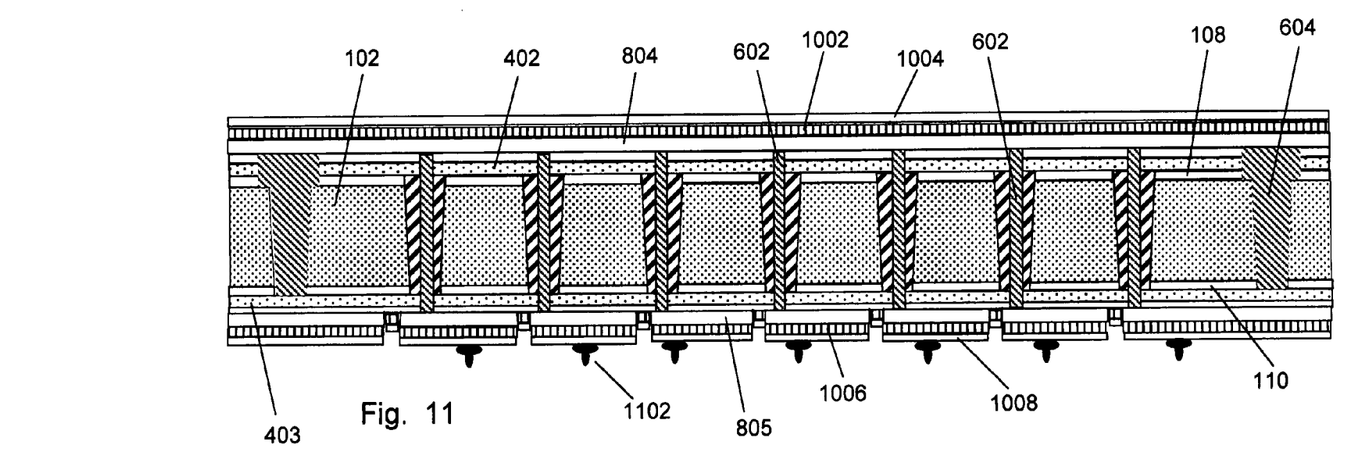
FIG. 11 is a cross-sectional representation of the partially constructed wafer translator of FIG. 10 after stud bumps are attached with positional reference to the alignment marks.

FIG. 11 is a cross-sectional representation of the partially constructed wafer translator of FIG. 10 after a plurality of stud bumps 1102 are attached to the surface of gold layer 1008. The attachment of stud bumps 1102 at locations, or positions, on the surface of gold layer 1008 is made relative to the etched alignment features 902. In typical embodiments, placement of stud bumps 1102 is determined by alignment within a predetermined tolerance to two or more alignment marks. Generally, such positioning of stud bumps 1102 is performed with reference to a "local" set of alignment marks 902, that is, a set of alignment marks within a predetermined proximity of the nominal stud bump position.

Still referring to FIG. 11, in some embodiments, the stud bumps are gold. In various alternative embodiments the stud bumps are formed from a platinum-iridium alloy. It will be appreciated that other suitable alloys may be used in the formation of stud bumps.

Figure 12:
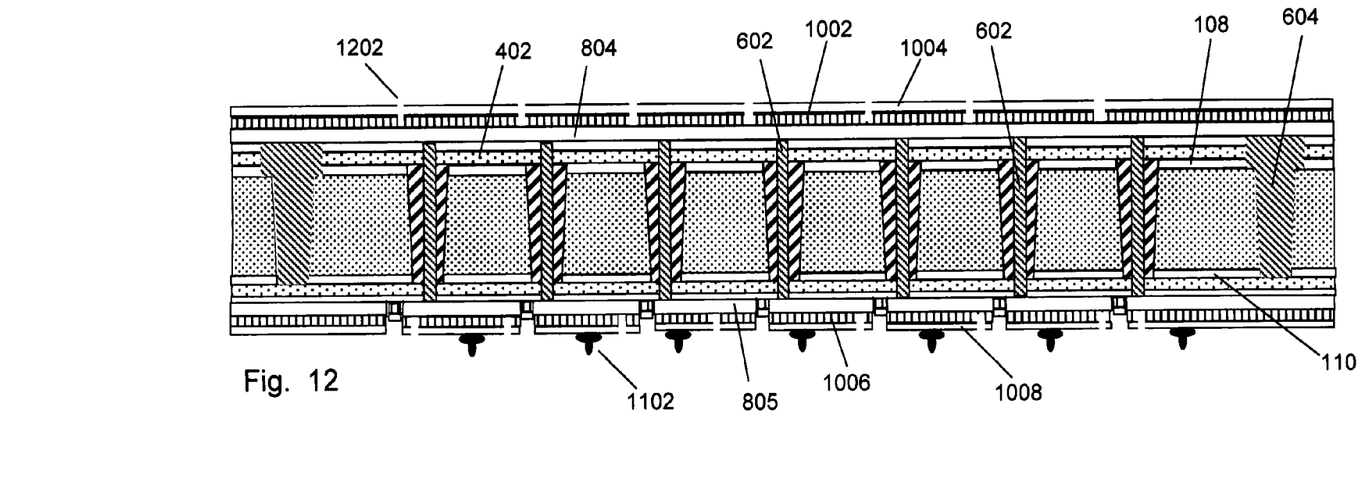
FIG. 12 is a cross-sectional representation of the partially constructed wafer translator of FIG. 11 after a pattern is laser scribed in the nickel and gold layers of each major surface.

FIG. 12 is a cross-sectional representation of the partially constructed wafer translator of FIG. 11 after a pattern is laser scribed in gold/nickel layers 1004/1002 and 1008/1006. In this illustrative embodiment, the copper layers underlying the respective gold/nickel layers are not significantly affected by the laser etching process. Further, the pattern formed in gold/nickel layers 1004/1002 is typically different than the pattern formed gold/nickel layers 1008/1006.

Figure 13:
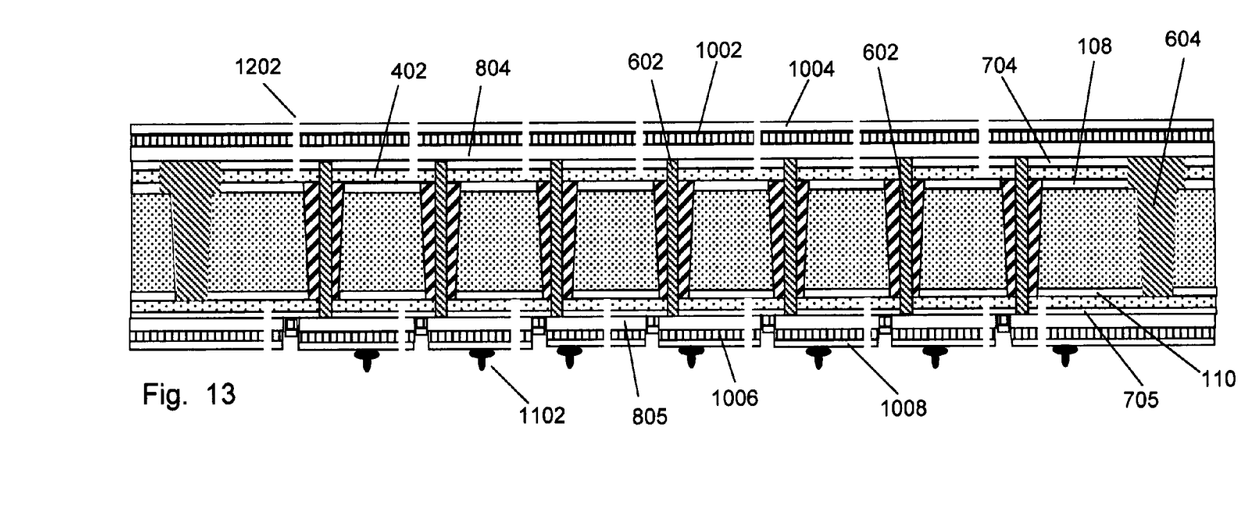
FIG. 13 is a cross-sectional representation of the partially constructed wafer translator of FIG. 12 after the copper layers on both sides are chemically etched using the nickel/gold layers as a mask.

FIG. 13 is a cross-sectional representation of the partially constructed wafer translator of FIG. 12 after the copper layers on both sides are chemically etched using the nickel/gold layers as a mask. That is, copper layers 804/704 and 8051705 are chemically etched where those layers have been exposed by the laser etching operation. The combination of laser etching and chemical etching forms spaces that electrically isolates various conductive regions that form the signal and power paths on each side of the wafer translator.

Still referring to FIG. 13, it is noted that both the copper metal and the resin layer underlying the RCC layers are typically chemically etched during the same chemical etching operation. If the chemical etchant used to remove copper is the same one used to remove the resin, then it is possible that the organic dielectric in the through-holes might also be etched if these spaces are located such that they cross the area of a through-hole. In one embodiment, layout rules that require the etched pattern to be spaced apart from the through-holes to avoid undesired etching of the organic dielectric are used. In another embodiment, the chemical etchant has a higher selectivity for removing copper and resin than for removing the organic material disposed in the through-holes. Additionally, the chemical etchant should have a higher selectivity for removing copper and resin than for removing the aluminum used for the ground plane in this illustrative embodiment. In a still further embodiment, the end point of the chemical etch operation may be determined by As a consequence of forming various spaces between conductive regions, a plurality of conductive pathways are created. In use, when the wafer translator and a wafer to be tested are removably attached to each other, these pathways provide electrical connections between circuits on the wafer and test or other circuits external to the wafer.

Figure 14:
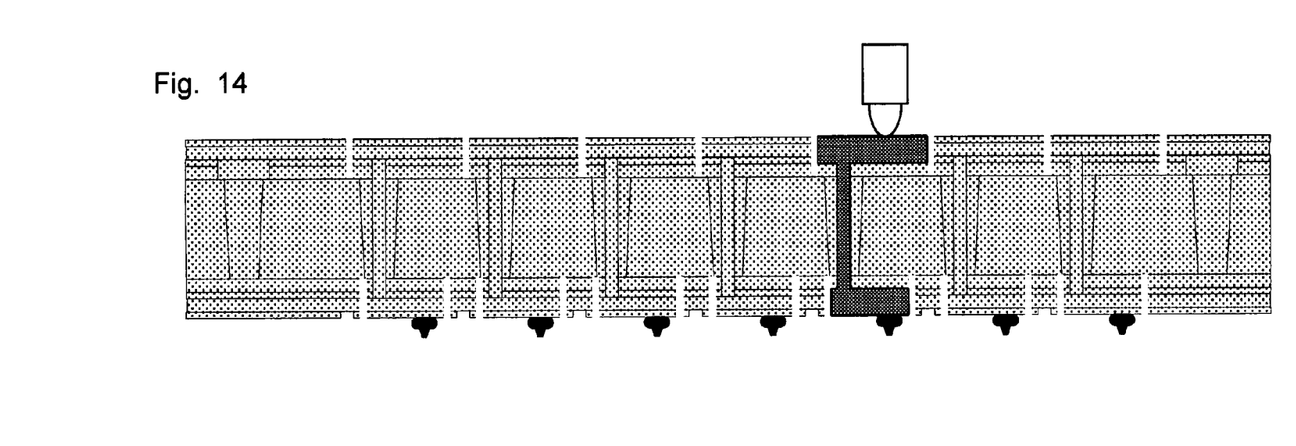
FIG. 14 is a cross-sectional representation of a completed wafer translator in accordance with the present invention.

FIG. 14 shows a cross-sectional representation of the completed silicon core wafer translator of FIG. 13, with an exemplary pogo pin contact structure making physical and electrical contact to an electrically conductive pathway on the inquiry-side of the translator, and further shows the electrically conductive pathway extending through a via to reach a conductive pathway and contact structure on the wafer-side of the translator.

Figure 15:
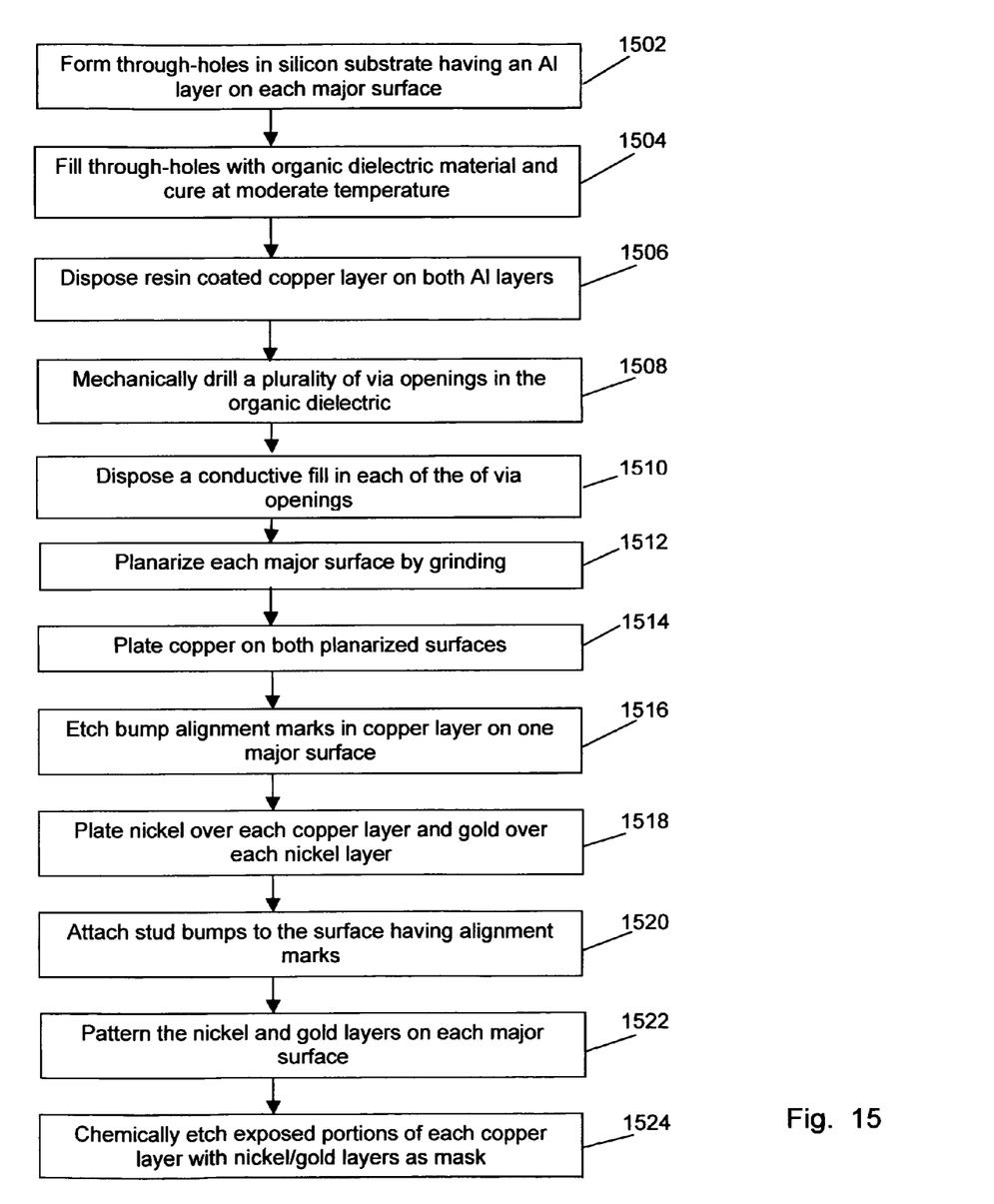
FIG. 15 is a high-level flow diagram of a process for fabricating a silicon core wafer translator having copper and subjacent resin layers disposed over a conductive layer.

Referring to FIG. 15, a high-level flow diagram of a process for fabricating a silicon core wafer translator having copper and subjacent resin layers disposed over a conductive layer superjacent the silicon core major surfaces in accordance with the present invention is shown. This process includes forming 1502 through-holes in a silicon substrate having an aluminum layer on each major surface thereof; filling 1504 the through-holes with organic dielectric material and curing at a moderate temperature; disposing 1506 resin coated copper foil on both aluminum surfaces; mechanically drilling 1508 a plurality of via openings in the organic dielectric; disposing 1510 a conductive filling in each of the via openings; planarizing 1512 each major surface by grinding; plating 1514 copper on both planarized surfaces; etching 1516 bump alignment marks in the copper layer on one of the surfaces of the partially constructed silicon core wafer translator; plating 1518 nickel over each exposed copper layer, and plating gold over each nickel layer; attaching 1520 stud bumps to the surface having alignment marks; patterning 1522 the nickel and gold layers on each major surface; and chemically etching 1524 the exposed portions of each copper layer with the patterned gold and nickel layers as an etch mask.

In some embodiments patterning of the nickel and gold layers is done by laser etching after the stud bumps have been attached, so to protect the stud bumps while the opposite surface of the partially constructed wafer translator is being laser etched, the bumped side (i.e., the wafer-side) is placed on a chuck with recesses into which the stud bumps are seated.

Another method of making a wafer translator having a silicon core, includes forming a plurality of through-holes in a silicon substrate, the silicon substrate having a first major surface and a second major surface; filling the plurality of through-holes with a dielectric material; disposing a first resin coated copper foil on the first major surface of the silicon substrate and a second resin coated copper foil on the second major surface of the silicon substrate; forming at least one via opening through the dielectric filling in each of the dielectric filled through-holes; disposing a conductive filling in each of the via openings; planarizing the copper of the first resin coated copper foil, and the copper of the second resin coated copper foil; plating a first conductive layer on the first planarized copper foil, and a second conductive layer on the second planarized copper foil; etching a plurality of contact structure alignment marks in the second conductive layer in a predetermined pattern; plating a first nickel layer over the first conductive layer and a second nickel layer over the second conductive layer; plating a first gold layer over the first nickel layer and a second gold layer over the second nickel layer; disposing a plurality of contact structures on the second gold layer, the contact structures disposed in a predetermined spatial relationship to the contact structure alignment marks; removing portions of the first gold layer and the first nickel layer to form a first pattern, and removing portions of the second gold layer and second nickel layer form a second pattern, the first pattern exposing a portion of the first conductive layer and the second pattern exposing a portion of the second conductive layer; and chemically etching the exposed portions of the first and second conductive layers, and the copper and resin layers respectively underlying the first and second conductive layers.

The combination of laser etching and chemical etching creates a first pattern of conductors on the inquiry-side and a second pattern of conductors on the wafer-side. The first pattern and the second pattern are typically different.

In some embodiments, disposing the plurality of contact structures comprises stud bumping. In some alternative embodiments, disposing the plurality of contact structures comprises disposing a masking layer over the second gold layer, patterning the masking layer, plating a plurality of conductive structures, and removing the masking layer.

Figure 16:
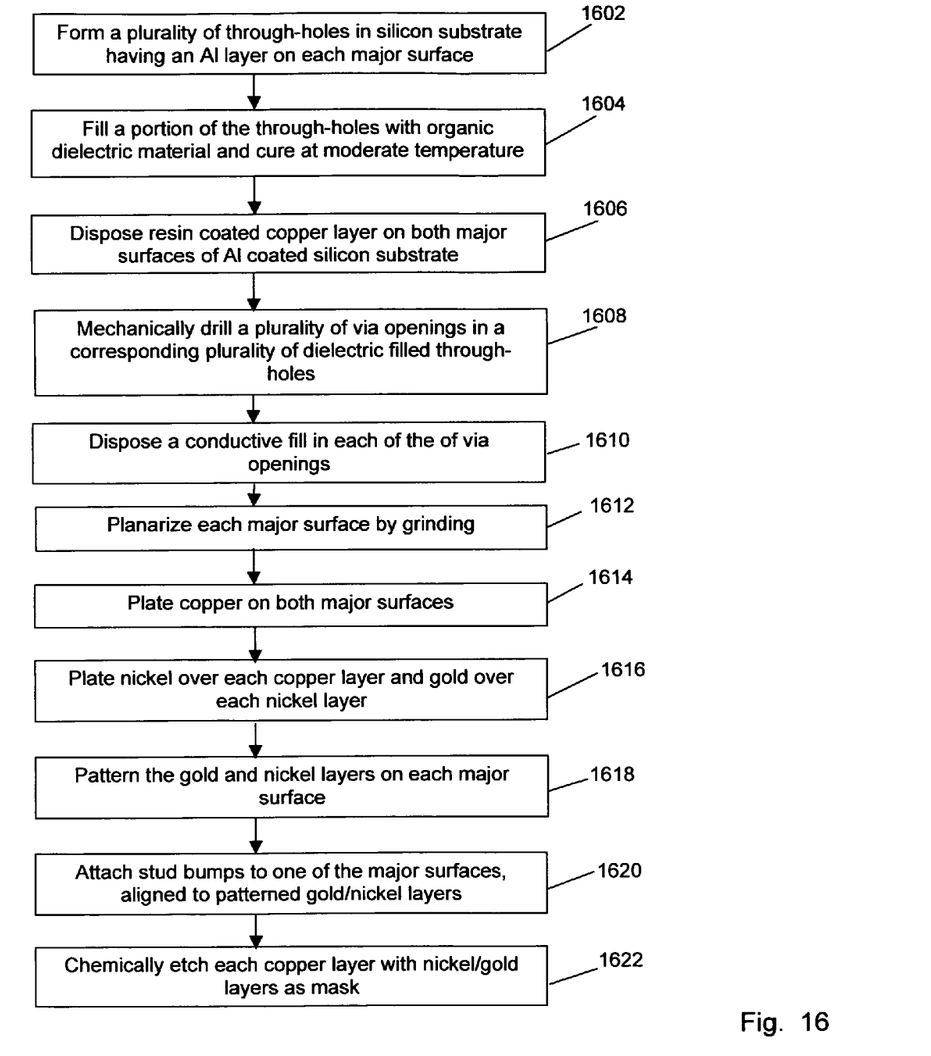
FIG. 16 is a high-level flow diagram of an alternative process for fabricating a silicon core wafer translator having a copper and subjacent resin layers disposed over a conductive layer.

Referring to FIG. 16, a high-level flow diagram of a process for fabricating a silicon core wafer translator having copper and subjacent resin layers disposed over a conductive layer superjacent the silicon core major surfaces in accordance with the present invention is shown. This process includes forming 1602 through-holes in a silicon substrate having an aluminum layer on each major surface thereof; filling 1604 the through-holes with organic dielectric material and curing at a moderate temperature; disposing 1606 resin coated copper foil on both aluminum surfaces; mechanically drilling 1608 a plurality of via openings in the organic dielectric; disposing 1610 a conductive filling in each of the via openings; planarizing 1612 each major surface by grinding; plating 1614 copper on both planarized surfaces; plating 1616 nickel over each copper layer and gold over each nickel layer; patterning 1618 the gold and nickel layers on each major surface; attaching 1620 stud bumps to one of the major surfaces aligned to patterned gold nickel layers; and chemically etching 1622 the exposed portions of each copper layer with the patterned gold and nickel layers as an etch mask.

Figure 17:
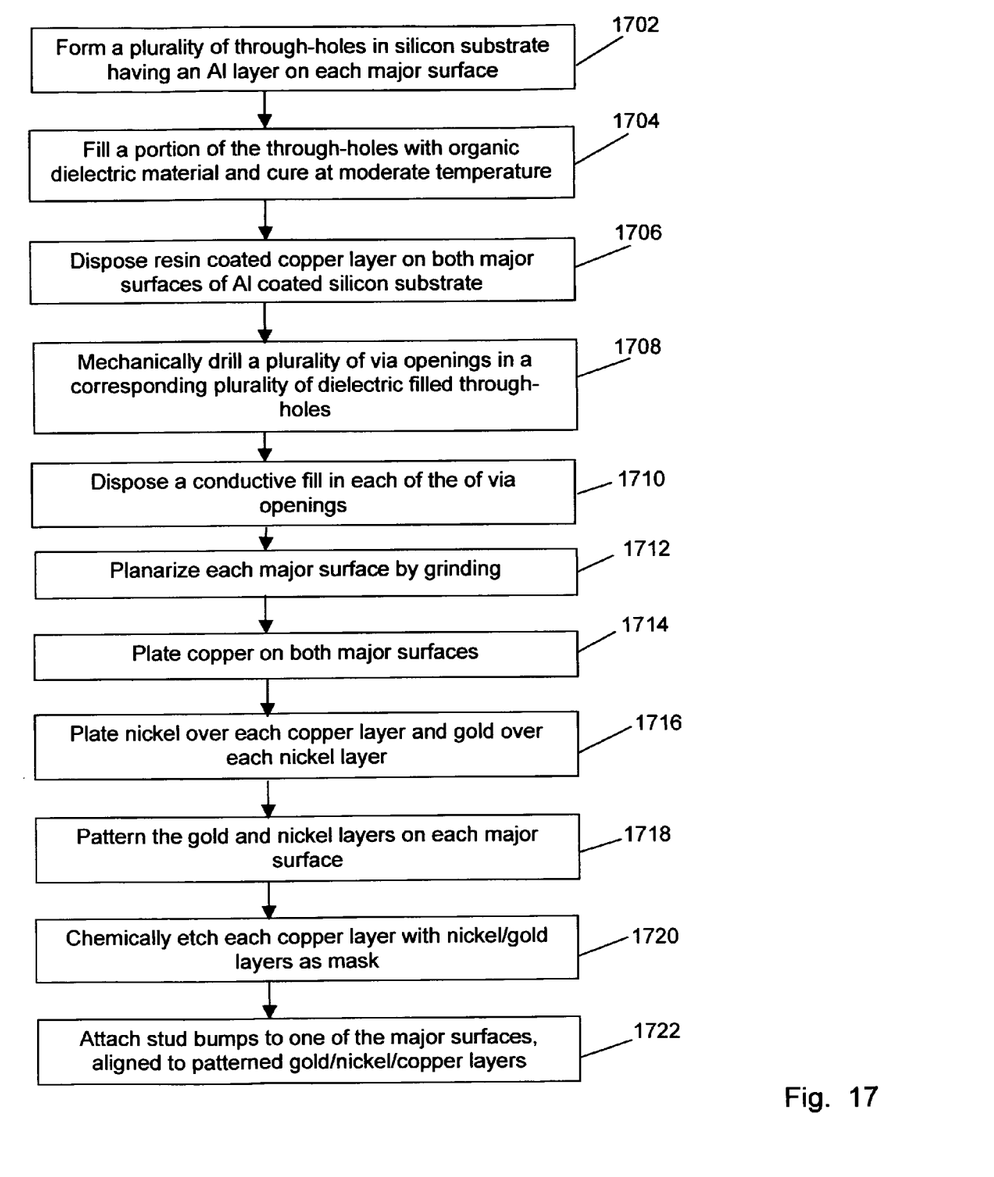
FIG. 17 is a high-level flow diagram of another alternative process for fabricating a silicon core wafer translator having a copper and subjacent resin layers disposed over a conductive layer.

Referring to FIG. 17, a high-level flow diagram of a process for fabricating a silicon core wafer translator having copper and subjacent resin layers disposed over a conductive layer superjacent the silicon core major surfaces in accordance with the present invention is shown. This process includes forming 1702 through-holes in a silicon substrate having an aluminum layer on each major surface thereof; filling 1704 the through-holes with organic dielectric material and curing at a moderate temperature; disposing 1706 resin coated copper foil on both aluminum surfaces; mechanically drilling 1708 a plurality of via openings in the organic dielectric; disposing 1710 a conductive filling in each of the via openings; planarizing 1712 each major surface by grinding; plating 1714 copper on both planarized surfaces; plating 1716 nickel over each copper layer and gold over each nickel layer; patterning 1718 the gold and nickel layers on each major surface; chemically etching 1720 the exposed portions of each copper layer with the patterned gold and nickel layers as an etch mask; and attaching 1722 stud bumps to one of the major surfaces aligned to patterned gold nickel layers.

In embodiments where the gold and nickel layers are laser etched, completing the laser etching prior to stud bump attachment advantageously eliminates the need for a chuck with recesses formed therein to accommodate the stud bumps during laser etching of the opposite side of the wafer translator.

CONCLUSION

The exemplary apparatus illustrated and described herein find application in at least the field of integrated circuit test and analysis.

It is to be understood that the present invention is not limited to the embodiments described above, but encompasses any and all embodiments within the scope of the subjoined Claims and their equivalents.

What is claimed is:

1. A method of making a wafer translator having a silicon core, comprising:
    providing a silicon substrate having a first electrically conductive layer disposed on a first major surface thereof and a second electrically conductive layer disposed on a second major surface thereof;
    forming a plurality of through-holes in the silicon substrate having the first electrically conductive layer on the first major surface and the second electrically conductive layer on the second major surface;
    filling the plurality of through-holes with a dielectric material;
    disposing a first resin coated copper foil on the first electrically conductive layer of the first major surface of the silicon substrate and disposing a second resin coated copper foil on the second electrically conductive layer of the second major surface of the silicon substrate;
    forming at least one via opening through the dielectric filling in each of the dielectric filled through-holes;
    disposing a conductive filling in each of the via openings;
    planarizing the copper of the first resin coated copper foil to form a first planarized copper foil, and planarizing the copper of the second resin coated copper foil to form a second planarized copper foil;
    plating a third conductive layer on the first planarized copper foil, and plating a fourth conductive layer on the second planarized copper foil;
    etching a plurality of contact structure alignment marks in the fourth conductive layer in a predetermined pattern;
    plating a first nickel layer over the third conductive layer and a second nickel layer over the second conductive layer;
    plating a first gold layer over the first nickel layer and a second gold layer over the second nickel layer;
    disposing a plurality of contact structures on the second gold layer, the contact structures disposed in a predetermined spatial relationship to the contact structure alignment marks;
    removing portions of the first gold layer and the first nickel layer to form a first pattern, and removing portions of the second gold layer and second nickel layer form a second pattern, the first pattern exposing a portion of the first conductive layer and the second pattern exposing a portion of the second conductive layer; and
    chemically etching the exposed portions of the third and second conductive layers, and the copper and resin layers respectively underlying the first and fourth conductive layers.

2. The method of claim 1, wherein the dielectric material is an organic dielectric material.

3. The method of claim 1, wherein forming the at least one via opening comprises mechanically drilling.

4. The method of claim 1, wherein the conductive filling includes copper.

5. The method of claim 1, wherein said planarizing comprises mechanically grinding.

6. The method of claim 1, wherein the first conductive layer and the second conductive layer are copper.

7. The method of claim 1, wherein disposing the plurality of contact structures comprises stud bumping.

8. The method of claim 1, wherein disposing the plurality of contact structures comprises patterning a masking layer, depositing a plurality of conductive structures, and removing the masking layer.

9. The method of claim 1, wherein said removing portions of the first gold layer and the first nickel layer to form the first pattern comprises laser etching.

10. The method of claim 1, wherein said removing portions of the second gold layer and second nickel layer to form the second pattern comprises laser etching.

11. The method of claim 1, further comprising:
forming a plurality of tooling holes in the silicon substrate;
masking the plurality of tooling holes prior to filling the plurality of through-holes with the dielectric material; and
uncovering the tooling holes by removing portions of the first resin coated copper foil.

12. The method of claim 1, wherein the first electrically conductive layer on the first major surface of the silicon substrate comprises aluminum; and the second electrically conductive layer of the second major surface of the silicon substrate comprises aluminum.

13. A wafer translator having a silicon core, comprising:
a silicon substrate having a first major surface and a second major surface, a first electrically conductive material layer disposed on the first major surface and a second electrically conductive material layer disposed on the second major surface, and further having a plurality of through-holes and a plurality of tooling holes through the silicon substrate and through the first and second electrically conductive material layers;
an organic dielectric material disposed in the plurality of through-holes;
a plurality of vias disposed through the organic dielectric material in each of the through-holes such that each via is electrically insulated from the silicon substrate;
a first planarized resin coated copper foil disposed on the first major surface, and a second planarized resin coated copper foil disposed on the second major surface;
a first plated copper layer disposed on the first planarized resin coated copper foil, and a second plated copper layer disposed on the second planarized resin coated copper foil;
a plurality of alignment marks disposed in the second plated copper layer;
a first nickel layer is disposed over the first plated copper layer, a first gold layer is disposed over the first nickel layer, a second nickel layer is disposed over the second plated copper layer, and a second gold layer is disposed over the second nickel layer;
a plurality of contact structures disposed on the second gold layer, each of the contact structures having a predetermined spatial relationship to at least two of the plurality of alignment marks;
a first plurality of spaces defining a first plurality of electrically isolated stacks formed from the first gold layer, the first nickel layer, the first plated copper layer, and the first planarized resin coated copper foil; and
a second plurality of spaces defining a second plurality of electrically isolated stacks formed from the second gold layer, the second nickel layer, the second plated copper layer, and the second planarized resin coated copper foil;
wherein the first plurality of electrically isolated stacks collectively have a different pattern than the second plurality of electrically isolated stacks.

14. The wafer translator of claim 13, wherein the first electrically conductive material disposed on the first major surface of the silicon substrate is aluminum, and the second electrically conductive material disposed on the second major surface of the silicon substrate is aluminum.

15. The wafer translator of claim 13, wherein the contact structures are stud bumps.

* * * * *